United States Patent
Sugawara

(10) Patent No.: US 7,327,615 B2
(45) Date of Patent: Feb. 5, 2008

(54) ELECTRIC POTENTIAL SWITCHING CIRCUIT, FLASH MEMORY WITH ELECTRIC POTENTIAL SWITCHING CIRCUIT, AND METHOD OF SWITCHING ELECTRIC POTENTIAL

(75) Inventor: Hiroshi Sugawara, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 180 days.

(21) Appl. No.: 11/178,370

(22) Filed: Jul. 12, 2005

(65) Prior Publication Data
US 2006/0012400 A1    Jan. 19, 2006

(30) Foreign Application Priority Data
Jul. 14, 2004    (JP)    ............... 2004-207805

(51) Int. Cl.
*G11C 5/14*    (2006.01)
(52) U.S. Cl. .................. 365/189.09; 365/189.05; 365/185.25; 365/203; 327/536; 326/58
(58) Field of Classification Search ........... 365/185.25, 365/203, 189.09, 189.05; 326/95–98, 56–58
See application file for complete search history.

(56) References Cited
U.S. PATENT DOCUMENTS
6,434,054 B1 * 8/2002 Shiga et al. ........... 365/185.29
6,487,120 B2 * 11/2002 Tanzawa et al. ....... 364/185.18
6,549,480 B2 * 4/2003 Hosogane et al. .......... 365/226
6,807,109 B2 * 10/2004 Tomishima ............ 365/189.05

FOREIGN PATENT DOCUMENTS
JP    2001-184879    7/2001

* cited by examiner

*Primary Examiner*—Rexford Barnie
*Assistant Examiner*—Crystal L Hammond
(74) *Attorney, Agent, or Firm*—Young & Thompson

(57) ABSTRACT

An electric potential switching circuit has an electric potential control circuit, an output circuit, and a precharge circuit connected to the output circuit. The electric potential control circuit generates a reference electric potential associated with an operation mode of a flash memory. The output circuit generates at an output terminal an output electric potential corresponding to the reference electric potential when enabled, and sets the output terminal to a high impedance state when disenabled. The output circuit is disenabled when the operation mode is switched from a first mode to a second mode. While the output circuit is disenabled, the electric potential control circuit switches the reference electric potential from a first electric potential associated with the first mode to a second electric potential associated with the second mode, and the precharge circuit precharges the output terminal in response to the reference electric potential.

7 Claims, 3 Drawing Sheets

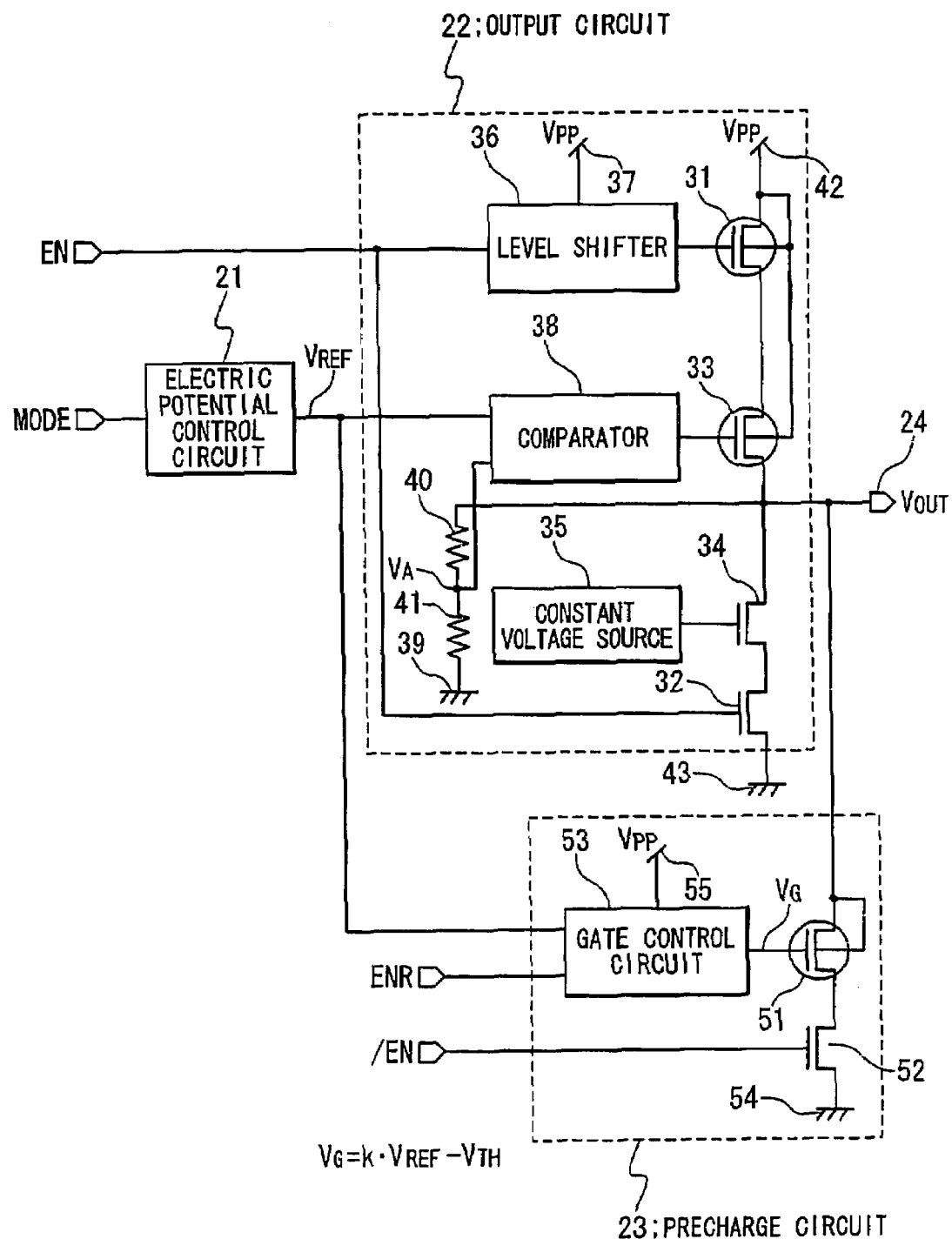

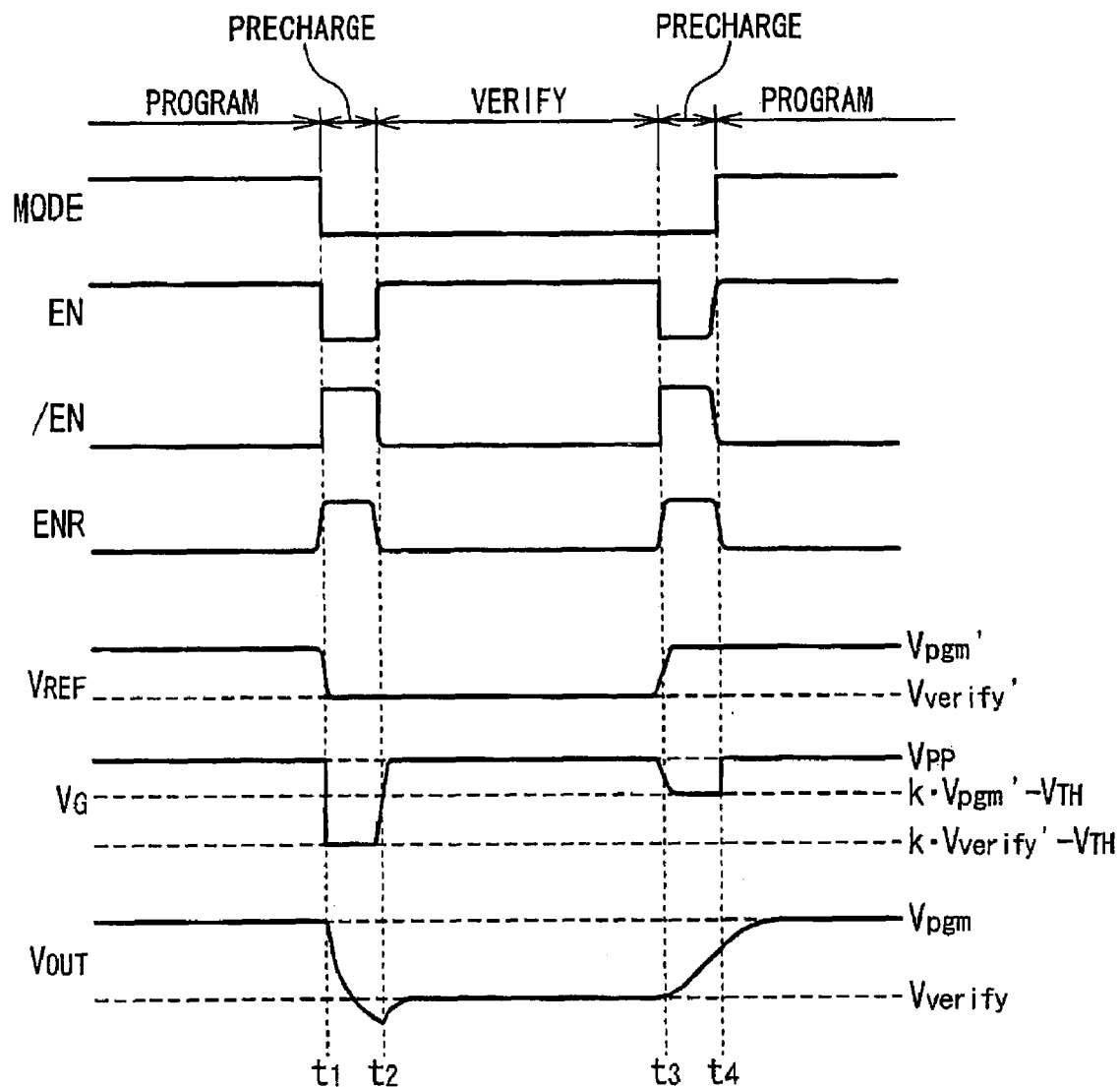

ELECTRIC POTENTIAL SWITCHING CIRCUIT, FLASH MEMORY WITH ELECTRIC POTENTIAL SWITCHING CIRCUIT, AND METHOD OF SWITCHING ELECTRIC POTENTIAL

BACKGROUND OF THE INVENTION

1. Field of the Invention

The present invention relates to an electric potential switching circuit, in particular, to an electric potential switching circuit used in a flash memory.

2. Description of the Related Art

As widely known to those skilled in the art, various levels of electrical potential need to be supplied to a peripheral circuit of a flash memory such as a decoder in response to an operation mode of the memory. For example, it is necessary to supply a high electrical potential of about 10V to a word line decoder when the flash memory is set to a program mode in which a data writing (programming) is performed, and to supply an intermediate electrical potential of about 5V to the word line decoder when the flash memory is set to a verify mode in which a data verifying is performed.

In order to reduce an access time of the flash memory, it is required to switch the electrical potential immediately when the operation mode is switched. An Unexamined Patent Publication No. 2001-184879 discloses an apparatus for switching an electrical potential supplied to a row decoder from an electrical potential used for verifying to an electrical potential used for data writing at high speed. The publicly known apparatus has a writing system charge pump, a reading system charge pump and an electrical potential switching circuit. The writing system charge pump generates the electrical potential used for the data writing, and the reading system charge pump generates the electric potential used for the verifying and data reading. The electric potential switching circuit outputs to the row decoder one of the electrical potential generated by the writing system charge pump and the electrical potential generated by the reading system charge pump. According to the publicly known apparatus, while the verifying is performed, the electric potential output from the writing system charge pump is increased to a potential higher than a potential to be supplied to a memory cell in the data writing. Subsequently, when the data writing is started, the electric potential switching circuit outputs the electric potential output by the writing system charge pump to the row decoder. Thus, the electric potential output to the row decoder is raised rapidly.

SUMMARY OF THE INVENTION

The present invention has recognized that the publicly known apparatus requires two charge pumps for the data writing and for the verifying. This is undesirable since the number of charge pumps mounted on the flash memory is increased. Increase in the number of charge pumps results in increase in area of a chip of the flash memory, which brings disadvantage in terms of cost.

In an aspect of the present invention, an electric potential switching circuit has an electric potential control circuit, an output circuit, and a precharge circuit connected to the output circuit. The electric potential control circuit generates a reference electric potential associated with an operation mode of a flash memory. The output circuit generates at an output terminal an output electric potential corresponding to the reference electric potential when enabled, and sets the output terminal to a high impedance state when disenabled. The output circuit is disenabled when the operation mode is switched from a first mode to a second mode. While the output circuit is disenabled, the electric potential control circuit switches the reference electric potential from a first electric potential associated with the first mode to a second electric potential associated with the second mode, and the precharge circuit precharges the output terminal in response to the reference electric potential.

According to the electric potential switching circuit thus constructed, the output electric potential is generated variably in response to the reference electric potential. Therefore, a plurality of charge pumps are unnecessary in order to generate the output electric potential. Moreover, it is possible to switch the output electric potential immediately because the output terminal is precharged in response to the reference electric potential while the output circuit is disenabled at the time when the operation mode is switched.

A method of switching an electric potential includes the following steps: (a) setting a reference electric potential to a first electric potential associated with a first mode as an operation mode of a flash memory; (b) generating at an output terminal an output electric potential corresponding to the reference electric potential by an output circuit; (c) setting the output circuit to a high impedance state by disenabling the output circuit; (d) switching the operation mode of the flash memory from the first mode to a second mode while the output circuit is disenabled; (e) switching the reference electric potential from the first electric potential to a second electric potential associated with the second mode while the output circuit is disenabled; (f) precharging the output terminal in response to the reference electric potential while the output circuit is disenabled; and (g) enabling the output circuit after the (f) precharging step, to generate at the output terminal an output electric potential corresponding to the second electric potential as the reference electric potential.

According to the present invention, the electric potential switching circuit is capable of outputting various levels of electric potential by using only a small number of charge pumps. Moreover, the electric potential switching circuit is capable of switching the electric potential immediately.

BRIEF DESCRIPTION OF THE DRAWINGS

The above and other objects, advantages and features of the present invention will be more apparent from the following description taken in conjunction with the accompanying drawings, in which:

FIG. 2 is a block diagram showing a configuration of the electric potential switching circuit according to the present embodiment; and FIG. 3 is a flow chart showing an operation of the electric potential switching circuit according to the present embodiment.

DESCRIPTION OF THE PREFERRED EMBODIMENTS

Figure 1:
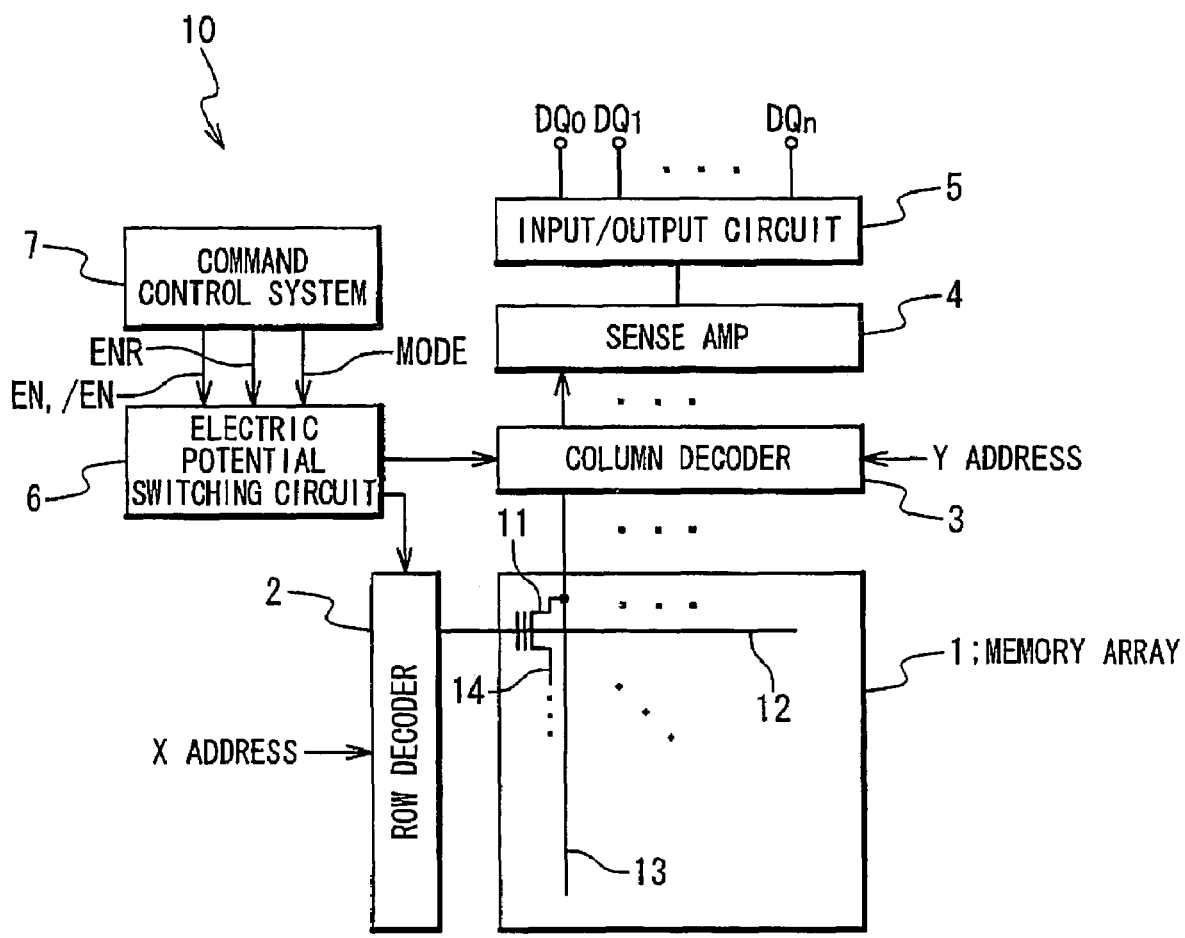
FIG. 1 is a block diagram showing a configuration of a flash memory having an electric potential switching circuit according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

I. Whole Configuration of Flash Memory

FIG. 1 is a block diagram showing a configuration of a main part of a flash memory 10 to which an embodiment of an electric potential switching circuit of the present invention is applied. The flash memory 10 has a memory array 1, a row decoder 2 and a column decoder 3. The memory array 1 has flash memory cells 11 arranged in a matrix form, word lines 12, bit lines 13 and source lines 14. For facilitating visualization, only one flash memory cell 11, one word line 12, one bit line 13 and one source line 14 are illustrated in the figure. As known to those skilled in the art, the flash memory cell 11 is comprised of a MOSFET having a floating gate. A control gate of the flash memory cell 11 is connected with the word line 12, a drain thereof is connected with the bit line 13, and a source thereof is connected with the source line 14. The row decoder 2 and the column decoder 3 are used for selecting a flash memory cell 11; the row decoder 2 is used for selecting a word line 12 in response to an X address, and the column decoder 3 is used for selecting a bit line 13 in response to a Y address. Programming or reading of data is performed with respect to the selected flash memory cell 11 connected to the selected word line 12 and the selected bit line 13.

The memory array 1 is connected to a sense amplifier 4 through the column decoder 3, and the sense amplifier 4 is connected to an input/output circuit 5. The sense amplifier 4 is used for writing data to the selected flash memory cell 11, and used for reading out data written in the selected flash memory cell 11. The input/output circuit 5 is used for supplying a write data to be written in the flash memory cell 11 from the outside, and used for outputting a read data read out from the flash memory cell 11 to the outside. The write data is supplied to the sense amplifier 4 through the input/output circuit 5. The read data identified by the sense amplifier 4 is output to the outside through the input/output circuit 5.

The row decoder 2 and the column decoder 3 are connected to an electric potential switching circuit 6. The electric potential switching circuit 6 supplies electrical potential to the row decoder 2 and the column decoder 3 according to an operation mode to which the flash memory 10 is set. More specifically, the electric potential switching circuit 6 supplies high electric potential of about 12V to the row decoder 2 and the column decoder 3, when the flash memory 10 is set to a program mode. The electric potential switching circuit 6 supplies intermediate electric potential of about 5V to the row decoder 2 and the column decoder 3, when the flash memory 10 is set to a verify mode. As described later, the subject matter of the present invention is to improve the electric potential switching circuit 6.

The electric potential switching circuit 6 is connected to a command control system 7. The command control system 7 supplies an internal control signal to each part of the flash memory 10 in response to external control signals (for example, a chip enable signal /CE, a row strobe signal /RAS, a column strobe signal /CAS) supplied from the outside. A mode setting signal MODE, enable signals EN, /EN, and a reset signal ENR are supplied to the electric potential switching circuit 6 from the command control system 7. The mode setting signal MODE is used for informing the electric potential switching circuit 6 of the operation mode to which the flash memory 10 is set. The mode setting signal MODE is activated when the flash memory 10 is set in the program mode. Otherwise (namely, the flash memory 10 is set in the verify mode), the mode setting signal MODE is deactivated. The enable signals EN, /EN are signals that complement each other, and are used for enabling or disenabling the electric potential switching circuit 6. The reset signal ENR is a signal for controlling the electric potential switching circuit 6. Role of the reset signal ENR will be described later.

In the following description, it should be noted that "/" attached to the top of a reference numeral referring to a signal denotes that the signal is low active, and no sign "/" denotes that the signal is high active. Activation of the low active signal means that the signal is pull down to ground electric potential, and activation of the high active signal means that the signal is pulled up to the power source electric potential.

II. Configuration of Electric Potential Switching Circuit

1. Summary of Electric Potential Switching Circuit

FIG. 2 is a block diagram showing a configuration of the electric potential switching circuit 6. The electric potential switching circuit 6 has an electric potential control circuit 21 (reference electric potential control circuit), an output circuit 22 and a precharge circuit 23 schematically.

The electric potential control circuit 21 (reference electric potential control circuit) is a circuit configured to generate a reference electric potential $V_{REF}$. The reference electric potential $V_{REF}$ is an electric potential that is used for controlling an output electric potential $V_{OUT}$ of the electric potential switching circuit 6 and corresponds to a target value of the output electric potential $V_{OUT}$. In the present embodiment, when the target value of the output electric potential $V_{OUT}$ is V', the reference electric potential $V_{REF}$ is generated so that the following equation:

$$V_{REF}=(1/k) \cdot V' \qquad (1)$$

is satisfied. Here, the k is a value larger than 1.

The reference electric potential $V_{REF}$ is generated in response to the mode setting signal MODE. As shown in FIG. 3, when the mode setting signal MODE is activated, that is, the flash memory 10 is set to the program mode, the reference electric potential $V_{REF}$ is generated so that the following equation:

$$V_{REF}=(1/k) \cdot V_{prg}(=V_{prg}') \qquad (1a)$$

is satisfied. Here, the $V_{prg}$ is an electric potential $V_{pgm}$ used for the data writing, and is typically 10V. On the other hand, when the mode setting signal MODE is deactivated, the reference electric potential $V_{REF}$ is generated so that the following equation:

$$V_{REF}=(1/k) \cdot V_{verify}(=V_{verify}') \qquad (1b)$$

is satisfied. Here, the $V_{verify}$ is an electric potential used for the verifying.

Returning back to FIG. 2, the output circuit 22 is a circuit configured to generate the output electric potential $V_{OUT}$ at an output terminal 24 in response to the reference electric potential $V_{REF}$. The output electric potential $V_{OUT}$ generated at the output terminal 24 is supplied to the row decoder 2 and the column decoder 3 mentioned above. The output circuit 22 is enabled or disenabled in response to the enable signal EN supplied from the command control system 7. When the enable signal EN is activated, the output circuit 22 generates the output electric potential $V_{OUT}$ corresponding to the reference electric potential $V_{REF}$. In the present embodiment, when the enable signal EN is activated, the output electric potential $V_{OUT}$ is controlled to electric potential "$k \cdot V_{REF}$". It should be noted that k also appears in the above-mentioned equation (1). When the enable signal EN is deactivated, the output circuit 22 sets the output terminal 24 to a high impedance state.

The precharge circuit 23 is a circuit configured to precharge the output terminal 24 while the output terminal 22 is disenabled. The precharge circuit 23 precharges the output terminal 24 in response to the reference electric potential $V_{REF}$. As will be described later, the precharge circuit 23 plays an important role for switching the output electric potential $V_{OUT}$ at high speed.

2. Configuration of Output Circuit

The output circuit 22 includes PMOS transistors 31, 33 and NMOS transistors 32, 34. The PMOS transistors 31, 33 are connected in series between the output terminal 24 and a power source terminal 42, and the NMOS transistors 32, 34 are connected in series between the output terminal 24 and ground terminal 43. High power source electric potential $V_{PP}$ is supplied to the power source terminal 42 from a charge pump (not shown). The power source electric potential $V_{PP}$ is equal to or higher than an electric potential used for the data writing. Substrate terminals of the PMOS transistors 31, 33 are connected to the power source terminal 42, and both of their electric potentials are the power source electric potential $V_{PP}$. The PMOS transistor 31 and the NMOS transistor 32 are used as a switching device that allows the output circuit 22 to output the output electric potential $V_{OUT}$ to the output terminal 24 in response to the enable signal EN. The PMOS transistor 33 is used as a control device for controlling the output electric potential $V_{OUT}$. The NMOS transistor 34, the gate of which is fixed at a predetermined electric potential, functions as a constant current source.

A gate of the PMOS transistor 31 is connected to a level shifter 36, and the PMOS transistor 31 is turned on or off by the level shifter 36. The level shifter circuit 36 is a circuit for turning on or off the PMOS transistor 31 in response to the enable signal EN. The power source electric potential $V_{PP}$ is supplied to a power source terminal 37 of the level shifter 36 from the above-mentioned charge pump (not shown), and the level shifter 36 is configured to be capable of outputting the power source electric potential $V_{PP}$. When the enable signal EN is activated, the level shifter circuit 36 supplies a ground electric potential $V_{SS}$ to the gate of the PMOS transistor 31 to turn on the PMOS transistor 31. On the contrary, when the enable signal EN is deactivated, the level shifter circuit 36 supplies the power source electric potential $V_{PP}$ to the gate of the PMOS transistor 31 to turn off the PMOS transistor 31.

The enable signal EN is directly input to a gate of the NMOS transistor 32. When the enable signal EN is activated, the NMOS transistor 32 is turned on. When the enable signal EN is deactivated, the NMOS transistor 32 is turned off.

A gate of the PMOS transistor 33 is connected to a comparator 38. The comparator 38 is used for controlling a current flowing through the PMOS transistor 33, thereby controlling the output electric potential $V_{OUT}$ generated at the output terminal 24. The output electric potential $V_{OUT}$ is controlled by using resistance devices 40, 41 provided between the output terminal 24 and a ground terminal 39. The resistance devices 40, 41 divide the output electric potential $V_{OUT}$, and generate an electric potential $V_A$ at a node between the resistance devices 40, 41. The electric potential $V_A$ is proportional to the output electric potential $V_{OUT}$, and according to the present embodiment, the electric potential $V_A$ is expressed by the following equation:

$$V_A = (1/k) \cdot V_{OUT} \quad (2)$$

It should be noted that the k also appears in the equation (1) which expresses the reference electric potential $V_{REF}$. The comparator 38 compares the electric potential $V_A$ with the reference electric potential $V_{REF}$ supplied from the electric potential control circuit 21, and generates a control electric potential $V_{DIF}$ corresponding to a difference between the electric potential $V_A$ and the reference electric potential $V_{REF}$. The comparator 38 supplies the control electric potential $V_{DIF}$ to the gate of the PMOS transistor 33. The current flowing through the PMOS transistor 33 is controlled according to the control electric potential $V_{DIF}$. Since the control electric potential $V_{DIF}$ is an electric potential corresponding to the difference between the electric potential $V_A$ and the reference electric potential $V_{REF}$, the output electric potential $V_{OUT}$ generated at the output terminal 24 is controlled in response to the reference electric potential $V_{REF}$.

A gate of the NMOS transistor 34 is connected to a constant voltage source 35. The constant voltage source 35 fixes the gate of the NMOS transistor 34 at a predetermined electric potential and makes the NMOS transistor 34 function as a constant current source. Due to the NMOS transistor 34, the amount of discharge current for discharging the output terminal 24 is kept constant.

3. Configuration of Precharge Circuit

The precharge circuit 23 has a PMOS transistor 51, a NMOS transistor 52 and a gate control circuit 53. The PMOS transistor 51 and the NMOS transistor 52 are connected in series between the output terminal 24 and a ground terminal 54. The gate control circuit 53 is connected to a gate of the PMOS transistor 51.

The gate control circuit 53 is a circuit for controlling an electric potential of the gate of the PMOS transistor 51. The gate control circuit 53 receives the reference electric potential $V_{REF}$ from the electric potential control circuit 21 and the reset signal ENR from the command control system 7, and generates an electric potential $V_G$ in response to these signals. The electric potential $V_G$ is applied to the gate of the PMOS transistor 51, thereby controlling the current flowing through the PMOS transistor 51. The power source electric potential $V_{PP}$ is supplied to a power source terminal 55 of the gate control circuit 53 from the above-mentioned charge pump (not shown), and the gate control circuit 53 is capable of outputting the power source electric potential $V_{PP}$ at the maximum.

The electric potential $V_G$ varies depending on the state of the reset signal ENR. When the reset signal ENR is deactivated, the electric potential $V_G$ is the power source electric potential $V_{PP}$ irrespective of the reference electric potential $V_{REF}$. On the other hand, when the reset signal ENR is activated, the electric potential $V_G$ is controlled to be an electric potential corresponding to the reference electric potential $V_{REF}$. According to the present embodiment, the electric potential $V_G$ is generated so that the following equation:

$$V_G = k \cdot V_{REF} - V_{TH} \quad (3)$$

is satisfied. It should be noted that the k appears in the above equation (1) representing the reference electric potential $V_{REF}$.

The $V_{TH}$ in the equation (3) is a constant introduced for preferably controlling the electric potential of the output terminal 24 by the precharge circuit 23. More specifically, the constant $V_{TH}$ plays a role of setting the electric potential of the gate of the PMOS transistor 51 to be lower than the electric potential of the output terminal 24 by $V_{TH}$. It is preferable that the $V_{TH}$ is set to be equal to a threshold voltage of the PMOS transistor 51. Thus, the electric potential of the output terminal 24 generated by the precharge circuit 23 becomes the same as "$k \cdot V_{REF}$", namely, the target value of the output terminal 24.

In the above-mentioned configuration of the electric potential switching circuit 6, it should be noted that the power source electric potential supplied from the charge pump (not shown) is only the power source electric potential $V_{PP}$. Since the electric potential switching circuit 6 controls variably the output electric potential $V_{OUT}$ in response to the reference electric potential $V_{REF}$, the one charge pump is enough for operating the electric potential switching circuit 6.

III. Operation of Electric Potential Switching Circuit

FIG. 3 is a timing chart showing an operation of the electric potential switching circuit 6. Providing that the flash memory 10 is set to the program mode in an initial state, the mode setting signal MODE and enable signals EN, /EN are activated. The reference electric potential $V_{REF}$ is set to $V_{pgm}'$ ($=(1/k) \cdot V_{pgm}$). Thus, the output electric potential $V_{OUT}$ of the electric potential switching circuit 6 is controlled to be the electric potential $V_{pgm}$. Furthermore, the reset signal ENR is deactivated. Accordingly, the electric potential $V_G$ output from the gate control circuit 53 is the power source electric potential $V_{PP}$, and the PMOS transistor 51 of the precharge circuit 23 is completely in the off state. Described hereinafter is an operation for switching the output electric potential $V_{OUT}$ from the electric potential $V_{pgm}$ to the electric potential $V_{verify}$ at the time when the operation mode of the flash memory 10 is switched from the program mode to the verify mode.

When the operation mode of the flash memory 10 is switched from the program mode to the verify mode, the enable signals EN, /EN. are firstly deactivated (time t1). That is, the enable signal EN is pulled down to a ground electric potential $V_{SS}$, and the enable signal /EN is pulled up to a power source electrical potential $V_{DD}$.

When the enable signal EN is pulled down, both of the PMOS transistor 31 and the NMOS transistor 32 of the output circuit 22 are turned off, and the output terminal 24 is electrically separated from both of the power source terminal 42 and the ground terminal 43. In other words, the output circuit 22 is disenabled and the output terminal 24 is set to a high impedance state. To disenable the output circuit 22 by the enable signal EN is important for preventing a through current from flowing through the PMOS transistors 31, 33 and 51 and the NMOS transistor 52 during the precharge of the output terminal 24, and thereby preventing an unnecessary variation in the power source.

In synchronization with the deactivation of the enable signal EN, the mode setting signal MODE is pulled down. Due to the pull-down of the mode setting signal MODE, the electric potential switching circuit 6 is informed that the next operation mode is the verify mode. In synchronization with the pull-down of the mode setting signal MODE, the electric potential control circuit 21 switches the reference electric potential $V_{REF}$ to the electric potential $V_{verify}'$ associated with the verify mode.

In addition, the reset signal ENR is activated. In synchronization with the deactivation of the enable signal /EN and the activation of the reset signal ENR, the precharge circuit 23 starts precharging the output electric potential $V_{OUT}$ to an electric potential "$V_{verify} - V_{TH} + V^P_{TH}$". Here, the $V^P_{TH}$ is a true value of the threshold voltage of the PMOS transistor 51. When the $V_{TH}$ is ideal and is equal to the $V^P_{TH}$, the output electric potential $V_{OUT}$ generated at the output terminal 24 coincides with the electric potential $V_{verify}$ which is a target value in the verify mode.

Described hereinafter is an operation in which the precharge circuit 23 precharges the output electric potential $V_{OUT}$ to the electric potential "$V_{verify} - V_{TH} + V^P_{TH}$ (ideally, $V_{verify}$)".

In response to the pull-up of the reset signal ENR, the gate control circuit 53 starts controlling the electric potential $V_G$ of the gate of the PMOS transistor 51 to the electric potential "$k \cdot V_{verify}' - V_{TH}$". Since the electric potential $k \cdot V_{verify}'$ is equal to the electric potential $V_{verify}$, the electric potential $V_G$ is equal to an electric potential "$V_{verify} - V_{TH}$".

When the electric potential of the gate of the PMOS transistor 51 is controlled to be the electric potential "$V_{verify} - V_{TH}$", the electric potential of the source of the PMOS transistor 51, namely, the electric potential of the output terminal 24 becomes an electric potential higher than the electric potential of the gate by the voltage $V^P_{TH}$, i.e., an electric potential "$V_{verify} - V_{TH} + V^P_{TH}$". Through such a process, the output electric potential $V_{OUT}$ of the electric potential switching circuit 6 is precharged to the electric potential "$V_{verify} - V_{TH} + V^P_{TH}$".

Following the precharge, the enable signals EN, /EN are activated and the reset signal ENR is deactivated (time t2). In response to the activation of the enable signal EN, the output circuit 22 starts controlling the output electric potential $V_{OUT}$ to be the electric potential $V_{verify}$. Since the output terminal 24 is already precharged to the electric potential "$V_{verify} - V_{TH} + V^P_{TH}$" prior to the activation of the enable signals EN, /EN, the output electric potential $V_{OUT}$ is immediately stabilized to the electric potential $V_{verify}$ after the verifying is started. That is to say, the switching of the output electric potential $V_{OUT}$ to the electric potential $V_{verify}$ is carried out immediately. In response to the activation of the enable signal /EN and the deactivation of the reset signal ERN, the precharge circuit 23 stops its operation. In addition, in response to the deactivation of the reset signal ENR, the electric potential $V_G$ output from the gate control circuit 53 is returned to the power source electric potential $V_{PP}$.

As described above, the precharge circuit 23 precharges the output terminal 24 to the electric potential "$V_{verify} - V_{TH} + V^P_{TH}$" which is close to the target value in the verify mode, before the enable signals EN, /EN are activated and the output circuit 22 is enabled. As a result, when the operation mode is switched from the program mode to the verify mode, the output electric potential $V_{OUT}$ is immediately switched from the electric potential $V_{prg}$ to the electric potential $V_{verify}$.

The same applies to a case where the operation mode of the flash memory 10 is switched from the verify mode to the program mode. First, the enable signals EN, /EN are deactivated (time t3). In response to the deactivation of the enable signals EN, /EN, the output circuit 22 is disenabled and hence the output terminal 24 is set to the high impedance state.

In synchronization with the deactivation of the enable signals EN, /EN, the mode setting signal MODE is pulled up. In response to the pull-up of the mode setting signal MODE, the electric potential control circuit 21 switches the reference electric potential $V_{REF}$ to the electric potential $V_{pgm}'$ associated with the program mode.

Furthermore, in synchronization with the deactivation of the enable signals EN, /EN, the reset signal ENR is activated. In response to the deactivation of the enable signal /EN and the activation of the reset signal ENR, the precharge circuit 23 starts precharging the output electric potential $V_{OUT}$ to the electric potential "$V_{pgm}-V_{TH}+V^P_{TH}$". More specifically, in response to the pull-up of the reset signal ENR, the gate control circuit 53 starts controlling the electric potential $V_G$ of the gate of the PMOS transistor 51 to the electric potential "$k\cdot V_{pgm}'-V_{TH}$". Since the electric potential $k\cdot V_{pgm}'$ is equal to the electric potential $V_{pgm}$, the electric potential $V_G$ is equal to the electric potential "$V_{pgm}-V_{TH}$". When the electric potential of the gate of the PMOS transistor 51 is controlled to be the electric potential "$V_{pgm}-V_{TH}$", the electric potential of the source of the PMOS transistor 51, namely, the electric potential of the output terminal 24 becomes an electric potential higher than the electric potential of the gate by the voltage $V^P_{TH}$, i.e., an electric potential "$V_{pgm}-V_{TH}+V_{TH}$". Through such a process, the output electric potential $V_{OUT}$ of the electric potential switching circuit 6 is precharged to the electric potential "$V_{pgm-VTH}+V^P_{TH}$".

Subsequently, the enable signals EN, /EN are activated and the reset signal ENR is deactivated (time t4). In response to the activation of the enable signal EN, the output circuit 22 starts controlling the output electric potential $V_{OUT}$ to be the electric potential $V_{pgm}$. Since the output terminal 24 is already precharged to the electric potential "$V_{pgm}-V_{TH}+V^P_{TH}$" prior to the activation of the enable signals EN, /EN, the output electric potential $V_{OUT}$ is immediately stabilized to the electric potential $V_{pgm}$ after the programming is started. That is to say, the switching of the output electric potential $V_{OUT}$ is carried out immediately. In response to the activation of the enable signal /EN and the deactivation of the reset signal ERN, the precharge circuit 23 stops its operation.

IV. Conclusion

As described above, the electric potential switching circuit 6 according to the present embodiment is configured such that the electric potential switching circuit 6 requires only one charge pump in order to output various levels of electric potential according to the operation mode. Moreover, the electric potential switching circuit 6 is configured such that the output terminal 24 is precharged to an electric potential corresponding to the next operation mode while the output circuit 22 is disenabled at the time when the operation mode is switched. Thus, the electric potential switching circuit 6 can immediately switch the output electric potential $V_{OUT}$ to a desired electric potential at the time when the operation mode is switched.

It is apparent that the present invention is not limited to the above embodiment, and that may be modified and changed without departing from the scope and spirit of the invention.

What is claimed is:

1. An electric potential switching circuit comprising:
a reference electric potential control circuit configured to generate a reference electric potential associated with an operation mode of a flash memory;
an output circuit separate from said reference electric potential control circuit and configured to receive said reference electric potential and to generate at an output terminal an output electric potential corresponding to said reference electric potential when enabled, and configured to set said output terminal to a high impedance state when disenabled; and
a precharge circuit connected to said output circuit,
wherein said output circuit is disenabled when said operation mode is switched from a first mode to a second mode,
said reference electric potential control circuit switches said reference electric potential from a first electric potential associated with said first mode to a second electric potential associated with said second mode while said output circuit is disenabled at a time when said operation mode is switched, and
said precharge circuit precharges said output terminal in response to said reference electric potential while said output circuit is disenabled.

2. The electric potential switching circuit according to claim 1,
wherein said precharge circuit includes:
a PMOS transistor whose source is connected to said output terminal; and
a gate control circuit supplying a gate electric potential corresponding to said reference electric potential to a gate of said PMOS transistor while said output circuit is disenabled.

3. The electric potential switching circuit according to claim 2,
wherein said gate electric potential is lower by a predetermined voltage than a target electric potential to be outputted from said output terminal when said operation mode is said second mode.

4. The electric potential switching circuit according to claim 3,
wherein said predetermined voltage is substantially equal to a threshold voltage of said PMOS transistor.

5. A flash memory comprising:
a memory array including a flash memory cell;
a decoder selecting said flash memory cell; and
an electric potential switching circuit connected to said decoder,
wherein said electric potential switching circuit includes:
a reference electric potential control circuit configured to generate a reference electric potential associated with an operation mode of said flash memory;
an output circuit separate from said reference electric potential control circuit and configured to receive said reference electric potential and to generate at an output terminal an output electric potential corresponding to said reference electric potential and to supply said output electric potential to said decoder; and
a precharge circuit connected to said output circuit,
wherein said output circuit generates said output electric potential at said output terminal in response to said reference electric potential when enabled, and sets said output terminal to a high impedance state when disenabled,
said output circuit is disenabled when said operation mode is switched from a first mode to a second mode,
said reference electric potential control circuit switches said reference electric potential from a first electric potential associated with said first mode to a second electric potential associated with said second mode while said output circuit is disenabled at a time when said operation mode is switched, and
said precharge circuit precharges said output terminal in response to said reference electric potential while said output circuit is disenabled.

6. A method of switching an electric potential comprising:
(a) setting a reference electric potential to a first electric potential associated with a first mode as an operation mode of a flash memory, the reference electric potential being switchable between the first electric potential and a second electric potential associated with a second mode different from the first mode;

(b) generating at an output terminal an output electric potential corresponding to said reference electric potential by an output circuit, the output circuit comparing the reference electric potential to the output electric potential and controlling the output electric potential based on the comparison;

(c) setting said output circuit to a high impedance state by disenabling said output circuit;

(d) switching said operation mode of said flash memory from said first mode to the second mode while said output circuit is disenabled;

(e) switching said reference electric potential from said first electric potential to the second electric potential while said output circuit is disenabled;

(f) precharging said output terminal in response to said reference electric potential while said output circuit is disenabled; and (g) enabling said output circuit after said (f) precharging, to generate at said output terminal an output electric potential corresponding to said second electric potential as said reference electric potential.

7. An electrical potential switching circuit comprising:

a reference electric potential control circuit outputting a reference electric potential in response to a mode setting signal;

an output circuit outputting an output potential to an output terminal in response to the reference electric potential and setting the output terminal to a high impedance state in a predetermined timing; and a precharge circuit precharging the output terminal in response to the reference electric potential in the predetermined timing.

* * * * *